United States Patent
Hsieh et al.

(10) Patent No.: US 7,943,917 B2
(45) Date of Patent: May 17, 2011

(54) NON-VOLATILE MEMORY CELL AND FABRICATION METHOD THEREOF

(75) Inventors: Chun-I Hsieh, Hsinchu (TW); Chang-Rong Wu, Taipei County (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 16 days.

(21) Appl. No.: 12/420,115

(22) Filed: Apr. 8, 2009

(65) Prior Publication Data
US 2010/0181545 A1    Jul. 22, 2010

(30) Foreign Application Priority Data
Jan. 21, 2009   (TW) ............................... 98102322 A

(51) Int. Cl.
*H01L 29/02* (2006.01)
*H01L 47/00* (2006.01)
*H01L 29/04* (2006.01)

(52) U.S. Cl. ............... 257/2; 257/3; 257/4; 257/E29.17; 257/E21.008; 257/E21.01

(58) Field of Classification Search .................. 257/2–4
See application file for complete search history.

(56) References Cited

U.S. PATENT DOCUMENTS

| | | | |
|---|---|---|---|
| 2003/0184921 A1* | 10/2003 | Sugita et al. | 360/324.1 |
| 2003/0207097 A1* | 11/2003 | Girardie | 428/216 |
| 2004/0004237 A1* | 1/2004 | Fox | 257/295 |
| 2005/0247921 A1* | 11/2005 | Lee et al. | 257/2 |
| 2006/0198957 A1* | 9/2006 | Lee et al. | 427/255.32 |
| 2006/0270239 A1* | 11/2006 | Triyoso et al. | 438/706 |
| 2007/0072424 A1* | 3/2007 | Lee et al. | 438/690 |
| 2007/0128858 A1* | 6/2007 | Haukka et al. | 438/656 |
| 2007/0148350 A1* | 6/2007 | Rahtu et al. | 427/249.17 |
| 2008/0017954 A1* | 1/2008 | Suzuki et al. | 257/637 |
| 2009/0152526 A1* | 6/2009 | Courtade et al. | 257/4 |

* cited by examiner

*Primary Examiner* — Michael S Lebentritt
*Assistant Examiner* — Karen M Kusumakar
(74) *Attorney, Agent, or Firm* — Volpe and Koenig, PC

(57) ABSTRACT

A non-volatile memory cell and the fabrication method thereof are provided. The non-volatile memory cell comprises a top electrode, a bottom electrode and an oxide layer disposed between the top electrode and the bottom electrode. The oxide layer comprises a relatively low oxygen content layer adjacent to the bottom electrode, a relatively high oxygen content layer adjacent to the top electrode, and a transition layer disposed between the relatively high and the relatively low oxygen content layers. The transition layer has an oxygen concentration within a range between those of the relatively high and the relatively low oxygen content layers.

8 Claims, 3 Drawing Sheets

NON-VOLATILE MEMORY CELL AND FABRICATION METHOD THEREOF

FIELD OF THE INVENTION

The present invention relates to a non-volatile memory cell and the fabrication method thereof, and more particularly to a resistive memory cell and the fabrication method thereof.

BACKGROUND OF THE INVENTION

In recent years, due to the popular application of the personal digital products such as the flash drive, digital camera, cell phone and MP3, the market of the non-volatile memory increases rapidly, which may be the rapidest increasing market among all kinds of memory ICs. Currently, the main product of the non-volatile memory is the flash memory. However, the current flash memory elements will gradually confront a challenge of physical limitation when a technology generation of 65 nm comes, and the flash memory further has many limitations such as the slow operation speed and the short operation period. Therefore, it is necessary to develop more capable memory technology for satisfying a huger market in the future.

Recently, in the non-volatile memory technology field, a technology for a resistive memory is newly developed and very promising. The main structure of the resistive memory is a MIM (metal-insulator-metal) structure, which is analogous to that of a capacitor, and a transition metal oxide layer is adopted as the material of the insulator layer. Therefore, many semiconductor factories already have the capability to produce the resistive memory. Furthermore, the temperature required for manufacturing the elements of the resistive memory is not high, so it is easy to integrate the manufacturing process thereof into the relative element or circuit processes.

In the current technology for operating a resistive memory, a forming process is usually to be performed initially, i.e. a bias is applied on the element, for bringing a soft breakdown in the oxide layer of the element, so as to increase the leakage current of the element, so that the element may start to have the characters of the resistive memory. However, this forming process is time-consuming in the whole process. An oxide layer having more defects needs to be adopted if the time of the forming process is to be shortened, but a worse quality of the oxide layer results in a bad endurance of the element, which makes the element unable to endure large frequency of operation.

In order to overcome the drawbacks in the prior art, a non-volatile memory cell and the fabrication method thereof are provided.

SUMMARY OF THE INVENTION

In accordance with one aspect of the present invention, a non-volatile memory cell is provided. The non-volatile memory cell comprises a top electrode, a bottom electrode and an oxide layer disposed between the top electrode and the bottom electrode. The oxide layer comprises a relatively low oxygen content layer adjacent to the bottom electrode, a relatively high oxygen content layer adjacent to the top electrode, and a transition layer disposed between the relatively high and the relatively low oxygen content layers. The transition layer has an oxygen concentration within a range between those of the relatively high and the relatively low oxygen content layers.

Preferably, the top and the bottom electrodes have a material being one of a metallic and a nonmetallic materials for an electrode of a memory, and the metallic material can be selected from a group consisting of Pt, Al and Ag.

Preferably, the oxide layer is a transition metal oxide layer, which comprises a material being one selected from a group consisting of Ti, perovskite, Zn, Ni, Cu, Mn, and a combination thereof.

Preferably, the relatively high oxygen content layer has a stoichiometric concentration of oxygen atom larger than 90%, the relatively low oxygen content layer has a stoichiometric concentration of oxygen atom less than 50%, and the transition layer has a stoichiometric concentration of oxygen atom within a range between 50% and 90%. In the present invention, the mentioned percentage of the stoichiometric concentration of oxygen atom is referred to a mole ratio of oxygen atom to metal ion in the metal oxide used in the oxide layer. For example, when $TiO_2$ is used as a material of the oxide layer, a stoichiometric concentration of oxygen atom larger than 90% means that the material is $TiO_{1.8\sim2}$, a stoichiometric concentration of oxygen atom less than 50% means that the material is $TiO_{0\sim1}$, and a stoichiometric concentration of oxygen atom within a range between 50% and 90% means that the material is $TiO_{1\sim1.8}$.

Preferably, the relatively high oxygen content layer has a thickness within a range between 10 nm to 30 nm.

In accordance with another aspect of the present invention, a method for fabricating a non-volatile memory cell is provided. The method comprises providing a top electrode and a bottom electrode, and depositing an oxide layer between the top electrode and the bottom electrode. The oxide layer comprises a relatively low oxygen content layer adjacent to the bottom electrode, a relatively high oxygen content layer adjacent to the top electrode, and a transition layer disposed between the relatively high and the relatively low oxygen content layers. The transition layer has an oxygen concentration within a range between those of the relatively high and the relatively low oxygen content layers.

Preferably, the depositing step is performed by one of a chemical vapor deposition (CVD) and a physical vapor deposition (PVD). Furthermore, an oxygen-containing gas is used in the depositing step, and an oxygen concentration of the oxygen-containing gas is increasing progressively during the depositing step.

Preferably, the depositing step is performed by an atomic layer deposition (ALD), which comprises sub-steps of providing a precursor; providing a purge gas; providing an oxygen-containing gas; providing the purge gas; and repeatedly performing the mentioned sub-steps. The respective oxygen concentration and the thickness of the transition layer, the relatively high and the relatively low oxygen content layers will be accurately controlled via the ALD adopted in the depositing step.

Preferably, as the mentioned sub-steps are repeatedly performed, an oxygen concentration of the provided oxygen-containing gas is controlled to be increasing progressively. Alternatively, as the mentioned sub-steps are repeatedly performed, a pulse time of the step of providing the oxygen-containing gas is controlled to be increasing progressively.

Preferably, the oxygen-containing gas comprises an oxygen atom, an oxide and a plasma. Furthermore, the precursor is one of an organometallic compound and a metal halide.

In accordance with a further aspect of the present invention, a non-volatile memory cell is provided. The non-volatile memory cell comprises a top electrode, a bottom electrode and an oxide layer disposed between the top electrode and the bottom electrode. The oxide layer has a depth and comprises a highest oxygen content sub-layer having a stoichiometric concentration of oxygen atom larger than 90%, and the stoichiometric concentration of oxygen atom of the oxide layer is decreasing progressively with the depth of the oxide layer.

Preferably, the highest oxygen content sub-layer is adjacent to the top electrode and has a thickness within a range between 10 nm to 30 nm.

Based on the above, a non-volatile memory cell and the fabrication method thereof are provided in the present invention. Oxide sub-layers each of which has different degrees of oxidation are used as the oxide layer of the resistive memory cell, and ALD is used to accurately control the respective oxygen concentration and the thickness of each oxide sub-layer. Therefore, the resistive memory cell provided in the present invention has advantages of time-saving and effort-saving of the forming process due to the existence of the relatively low oxygen content layer, and good endurance due to the existence of the relatively high oxygen content layer.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present preferred embodiment will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
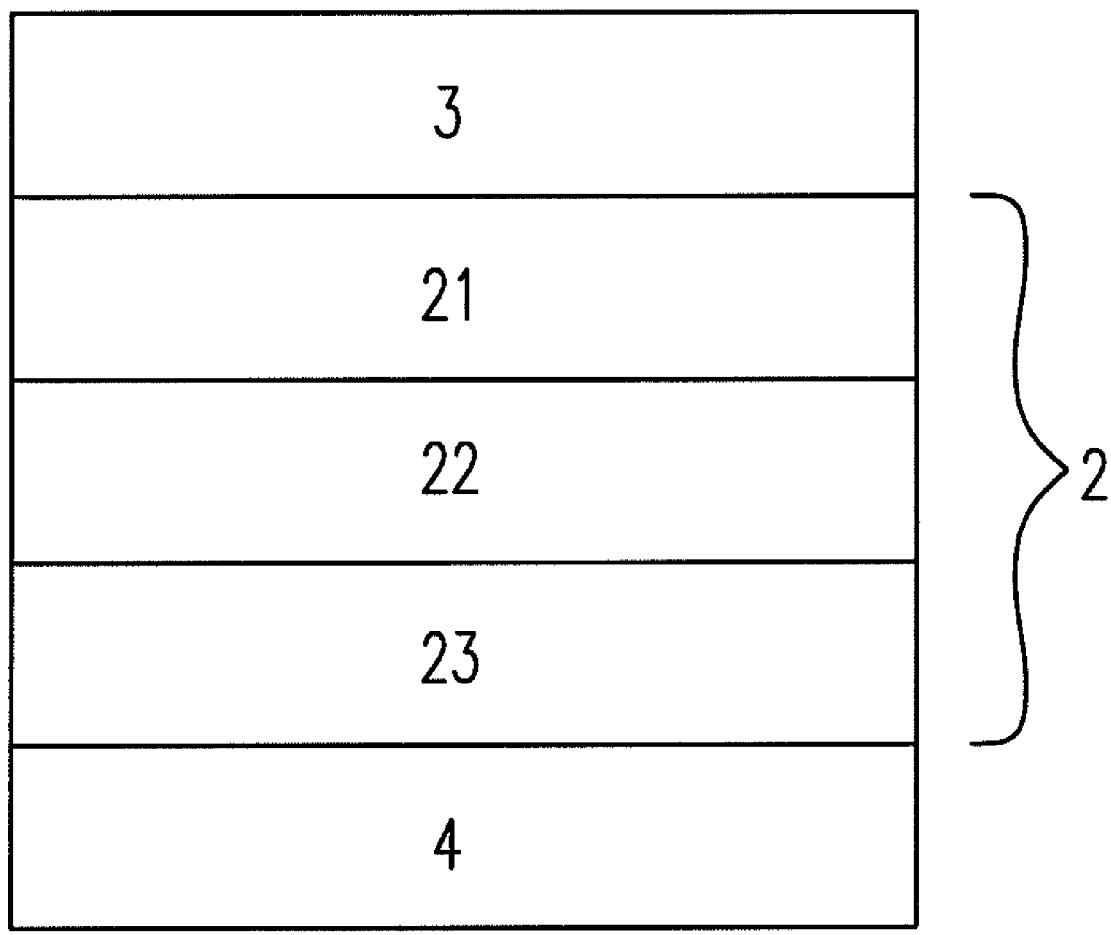
FIG. 1 is a diagram showing a non-volatile memory cell according to an embodiment of the present invention.

Please refer to FIG. 1, showing a non-volatile memory cell according to an embodiment of the present invention. The non-volatile memory cell 1 comprises a top electrode 3, a bottom electrode 4 and an oxide layer 2. The oxide layer 2 is disposed between the top electrode 3 and the bottom electrode 4, and comprises a relatively high oxygen content layer 21, a transition layer 22 and a relatively low oxygen content layer 23. The relatively high oxygen content layer 21 is adjacent to the top electrode 3, and the relatively low oxygen content layer 23 is adjacent to the bottom electrode 4. The transition layer 22 is disposed between the relatively high oxygen content layer 21 and the relatively low oxygen content layer 23, and has an oxygen concentration within a range between those of the relatively high and the relatively low oxygen content layers 21, 23. The oxygen concentration is referred to a stoichiometric concentration of oxygen atom in the metal oxide used in the oxide layer 2. For example, the oxygen concentration of TiO is represented as 50% when that of $TiO_2$ is represented as 100%.

According to the mentioned embodiment, the oxygen concentration of the relatively high oxygen content layer 21 will be controlled in a range between 90% and 100%, the oxygen concentration of the relatively low oxygen content layer 23 will be controlled to be less than 50%, and the oxygen concentration of the transition layer 22 will be controlled in a range between 50% and 90%. For example, when $TiO_x$ is used as the transition metal oxide material of the oxide layer 2, $TiO_{1.8\sim2}$ is deposited in the relatively high oxygen content layer 21, $TiO_{x<1}$ is deposited in the relatively low oxygen content layer 23, and $TiO_{1\sim1.8}$ is deposited in the transition layer 22. Furthermore, a thickness of the relatively high oxygen content layer 21 will be controlled within a range between 10 nm to 30 nm, so as to obtain fine quality and good endurance of the operating layer of the non-volatile memory cell 1.

Figure 2A:
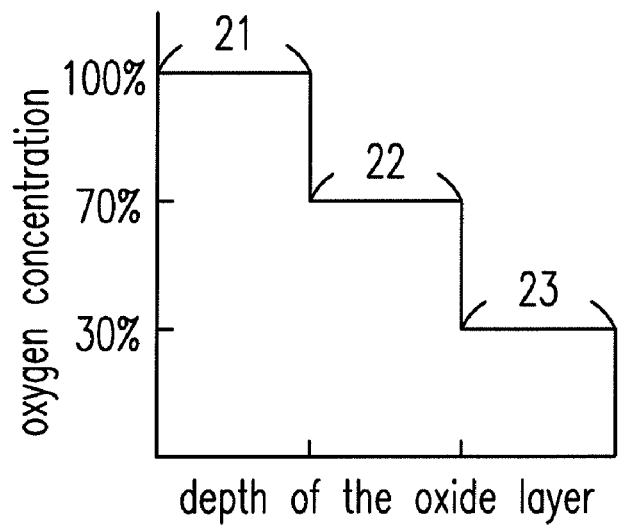
FIG. 2(A) is a diagram showing a relationship between the oxygen concentration and the depth of the oxide layer in FIG. 1.
Figure 2B:
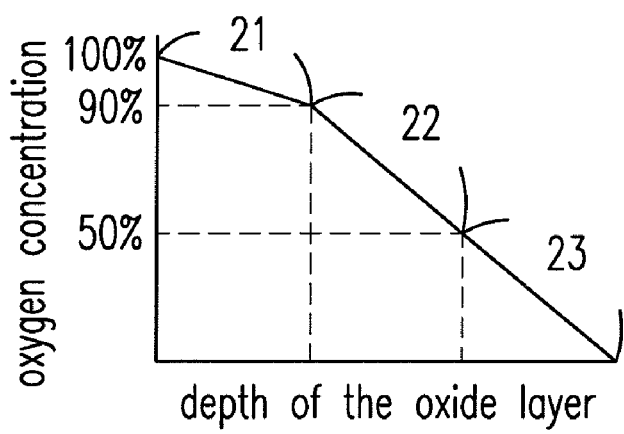
FIG. 2(B) is a diagram showing another relationship between the oxygen concentration and the depth of the oxide layer in FIG. 1.

Please refer to FIGS. 2(A) and 2(B), respectively showing a relationship and another relationship between the oxygen concentration and the depth of the oxide layer 2 in FIG. 1. As FIG. 2(A) shows, the respective oxygen concentrations of the relatively high oxygen content layer 21, the transition layer 22 and the relatively low oxygen content layer 23 are fixed values. For example, the oxygen concentrations of the layers 21, 22 and 23 are respectively 100%, 70% and 30%. As FIG. 2(B) shows, the respective oxygen concentrations of the layers 21, 22 and 23 are inversely proportional to the respective depths of the layers 21, 22 and 23. Moreover, the oxygen concentration of the layer 21 is in a range between 90% and 100%, the oxygen concentration of the transition layer 22 is in a range between 50% and 90%, and that of the layer 23 is less than 50%.

Figure 3:
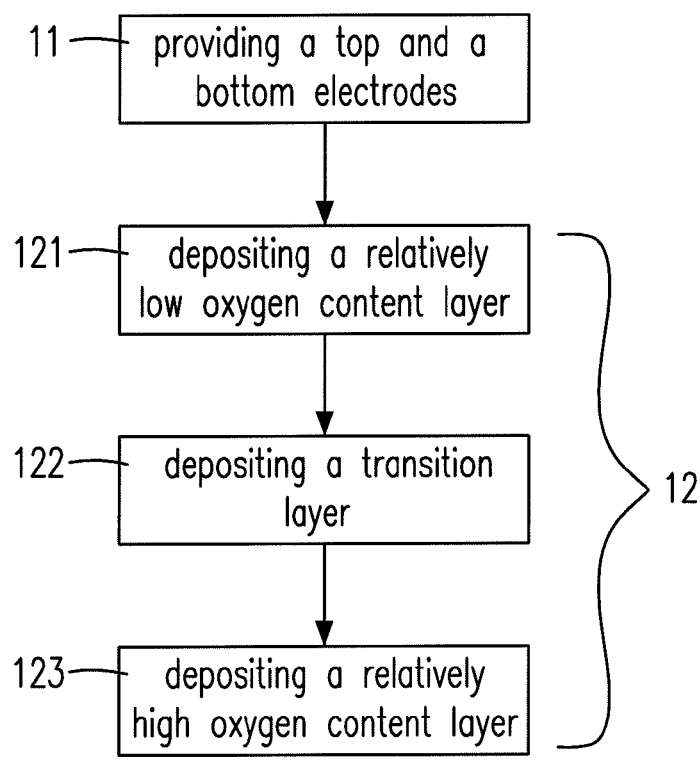
FIG. 3 is a flow chart of the method for fabricating a non-volatile memory cell according to an embodiment of the present invention.

Please refer to FIG. 3, showing a flow chart of the method for fabricating a non-volatile memory cell according to an embodiment of the present invention. Firstly, a top electrode and a bottom electrode are provided (step 11), and an oxide layer is deposited between the top electrode and the bottom electrode (step 12). The step 12 comprises the sub-steps of depositing a relatively low oxygen content layer (step 121), subsequently depositing a transition layer (step 122), and then depositing a relatively high oxygen content layer (step 123). The relatively low oxygen content layer is adjacent to the bottom electrode, the relatively high oxygen content layer is adjacent to the top electrode, and the transition layer is disposed between the relatively high and the relatively low oxygen content layers. Furthermore, the respective oxygen concentrations of the relatively low oxygen content layer, the transition layer and the relatively high oxygen content layer are different from one another, and that of the transition layer is within a range between those of the relatively high and the relatively low oxygen content layers.

According to the mentioned embodiment, the depositing step 12 is performed by one of a chemical vapor deposition and a physical vapor deposition, and also could be performed by any other deposition methods for depositing oxide sub-layers each of which has different degrees of oxidation from one another. An oxygen-containing gas is used in the depositing step 12, and an oxygen concentration of the oxygen-containing gas is increasing progressively when the steps 121~123 are performed in order. Alternatively, the oxygen concentration of the oxygen-containing gas is a fixed value in the steps 121~123, and other parameters, such as the pulse time, pressure, flowing speed and power, are controlled in the steps 121~123, so as to deposit the oxide layer having progressively increasing oxygen concentration.

In another preferred embodiment, the depositing step 12 is performed by an atomic layer deposition, through which the respective oxygen concentration and the thickness of each oxide sub-layer can be accurately controlled. In this embodiment, the following sub-steps are performed in each of the steps 121~123: providing a precursor; providing a purge gas; providing an oxygen-containing gas; and providing the purge gas again. After the step 121, the oxygen concentration of the oxygen-containing gas is increasing in the step 122 and more increasing in the step 123; alternatively, the pulse time of the deposition is increasing in the step 122 and more increasing in the step 123 after the step 121, so as to form the oxide layer having progressively increasing oxygen concentration.

In the mentioned embodiment, the oxygen-containing gas comprises an oxygen atom, an oxide and a plasma, and the precursor is one of an organometallic compound and a metal halide.

Figure 4:
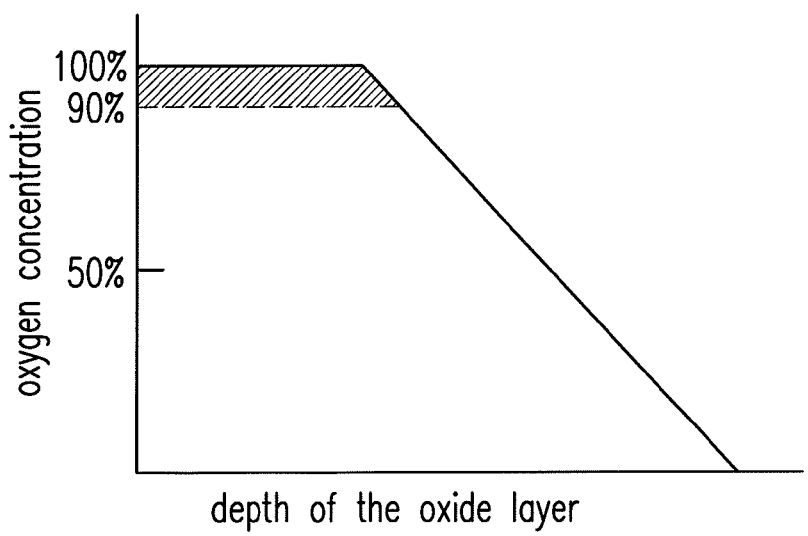
FIG. 4 is a diagram showing a relationship between the oxygen concentration and the depth of an oxide layer of a non-volatile memory cell according to another embodiment of the present invention.

Please refer to FIG. 4, showing a relationship between the oxygen concentration and the depth of an oxide layer of a non-volatile memory cell according to another embodiment of the present invention. As FIG. 4 shows, the oxide layer comprises a highest oxygen content sub-layer having a stoichiometric concentration of oxygen atom larger than 90%, and the stoichiometric concentration of oxygen atom of the oxide layer is decreasing progressively with a depth of the oxide layer. In this embodiment, the highest oxygen content sub-layer is adjacent to the top electrode, and has a thickness within a range between 10 nm to 30 nm.

In the above-mentioned embodiments, the top and the bottom electrodes 3, 4 have a material being one of a metallic and a nonmetallic materials for an electrode of a memory. For example, the metallic material can be selected from a group consisting of Pt, Al and Ag. Furthermore, the oxide layer 2 is a transition metal oxide layer, which comprises a material being one selected from a group consisting of Ti, perovskite, Zn, Ni, Cu, Mn, and a combination thereof. It is to be noted that the respective thicknesses of the transition layer 22, the relatively high and the relatively low oxygen content layers 21, 23 may be adjusted and designed when different metal oxides are used as the material of the oxide layer 2.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a non-volatile memory cell, comprising steps of:
   providing a top electrode and a bottom electrode; and
   depositing an oxide layer between the top electrode and the bottom electrode by using a precursor including a metal halide, wherein the metal halide includes a metal being one selected from a group consisting of Zn, Ni, Cu and Mn, and the oxide layer comprises:
   a first layer adjacent to the bottom electrode having a first oxygen concentration; a second layer adjacent to the top electrode having a second oxygen concentration, wherein the first oxygen concentration is less than the second oxygen concentration; and a transition layer disposed between the first and second layers, and having a third oxygen concentration within a range between the first and second oxygen concentrations.

2. The method according to claim 1, wherein the depositing step is performed by one of a chemical vapor deposition (CVD) and a physical vapor deposition (PVD).

3. The method according to claim 2, wherein an oxygen-containing gas is used in the depositing step, and an oxygen concentration of the oxygen-containing gas is increasing progressively during the depositing step.

4. The method according to claim 1, wherein the depositing step is performed by an atomic layer deposition (ALD).

5. The method according to claim 4, wherein the depositing step comprises sub-steps of:
   (a) providing the precursor;
   (b) providing a purge gas;
   (c) providing an oxygen-containing gas;
   (d) providing the purge gas; and
   (e) repeatedly performing the steps (a) to (d).

6. The method according to claim 5, further comprising a step of:
   controlling an oxygen concentration of the oxygen-containing gas in the step (c) to be increasing progressively as the step (e) is performed.

7. The method according to claim 5, further comprising a step of:
   controlling a pulse time of the step (c) to be increasing progressively as the step (e) is performed.

8. The method according to claim 5, wherein the oxygen-containing gas comprises an oxygen atom, an oxide and a plasma.

* * * * *